(12) United States Patent
Ohshima

(10) Patent No.: US 7,177,130 B2
(45) Date of Patent: Feb. 13, 2007

(54) OVERCURRENT DETECTION AND PROTECTION APPARATUS FOR SWITCHING ELEMENT

(75) Inventor: Shunzou Ohshima, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 191 days.

(21) Appl. No.: 10/478,106

(22) PCT Filed: May 22, 2002

(86) PCT No.: PCT/JP02/04963

§ 371 (c)(1),
(2), (4) Date: Jun. 7, 2004

(87) PCT Pub. No.: WO02/097940

PCT Pub. Date: Dec. 5, 2002

(65) Prior Publication Data

US 2004/0207967 A1    Oct. 21, 2004

(30) Foreign Application Priority Data

May 25, 2001 (JP) ............................. 2001-157750

(51) Int. Cl.
*H02H 9/08* (2006.01)
(52) U.S. Cl. .................................................. 361/93.9
(58) Field of Classification Search ................ 361/93.9
See application file for complete search history.

(56) References Cited

U.S. PATENT DOCUMENTS

| 5,796,278 A | * | 8/1998 | Osborn et al. ............... 327/108 |
| 6,011,413 A | | 1/2000 | Hayakawa et al. ........... 327/51 |
| 6,222,709 B1 | * | 4/2001 | Baba ............................ 361/18 |
| 6,229,355 B1 | | 5/2001 | Ogasawara .................. 327/108 |

\* cited by examiner

*Primary Examiner*—Chau N. Nguyen
*Assistant Examiner*—Scott Bauer
(74) *Attorney, Agent, or Firm*—Finnegan, Henderson, Farabow, Garrett & Dunner, L.L.P.

(57) ABSTRACT

An overcurrent detection/protection apparatus protects a switching element (T11) from an overcurrent. When a current flows through the switching element, a voltage drop occurs. The apparatus amplifies the voltage drop and generates a first voltage (V15). And, the apparatus divides a voltage at a node between the switching element and a load and generates a second voltage (V14). If the first voltage exceeds the second voltage, the apparatus concludes that there is an overcurrent. Due to wiring inductance (L) and the ON resistance (Ron) of the switching element, the second voltage decreases when an overcurrent flows. Accordingly, the apparatus can instantaneously detect an overcurrent, which may be caused by a dead short, and rendering the switching element inoperative, to thereby protect the switching element and wiring between the switching element and the power source. The apparatus employs no shunt resistors, and therefore, is compact and low-cost.

13 Claims, 6 Drawing Sheets

TIME (20.0ms/div)

TIME (20.0 μs/div)

OVERCURRENT DETECTION AND PROTECTION APPARATUS FOR SWITCHING ELEMENT

TECHNICAL FIELD

The present invention relates to an overcurrent detection apparatus for detecting an overcurrent flowing through a semiconductor switch and wiring that are arranged between a load and a power source.

BACKGROUND ART

A load such as a lamp or a motor installed in, for example, a vehicle receives a DC voltage for operation from a battery. Such a load is sometimes subjected to an overcurrent caused by circuit failure or malfunction. The overcurrent overheats and damages a semiconductor switch provided for the load as well as harness connecting the load to the battery.

To quickly detect an overcurrent and cuts a circuit between a power source and a load, various overcurrent detection and disconnection circuits have been proposed. An example of the overcurrent detection circuits according to a related art arranges a shunt resistor in wiring between a power source and a load, detects a terminal voltage of the shunt resistor, and if the detected voltage is above a reference voltage, disconnects the load from the power source.

If an overcurrent flows to the load, the terminal voltage of the shunt resistor increases. The related art detects the terminal voltage, and if the detected voltage is above the reference voltage, cuts a self holding circuit of a relay connecting the load to the power source, thereby preventing the overcurrent from flowing to the load.

DISCLOSURE OF INVENTION

The overcurrent detection circuit of the related art needs a circuit to detect the terminal voltage of the shunt resistor. Such a circuit increases the size and cost of the detection circuit. In addition, the shunt resistor causes an energy loss due to heat generated by a current passing through the shunt resistor.

The present invention provides an overcurrent detection apparatus that is compact and low-cost According to a first aspect of the present invention, an overcurrent protection circuit protects a switching element (T11) from an overcurrent. The switching element has a first electrode connected to a power source (VB) through a conductor (25) involving an internal impedance and a second electrode connected to a load (L1). The overcurrent protection circuit has a current detection circuit to detect a current (I) flowing between the first and second electrodes of the switching element into a voltage with a resistance between the first and second electrodes of the switching element, amplify the detected voltage by an amplification factor, and provide a first voltage (V15). The overcurrent protection circuit also has a voltage detection circuit (R22, R24) to generate a second voltage (V14) proportional to a voltage at the second electrode of the switching element. If the first voltage is above the second voltage, the overcurrent protection circuit determines that there is an overcurrent and renders the switching element inoperative.

A second aspect of the present invention expands the first aspect. The current detection circuit includes a first resistor (R23), a second switch (T12), a first comparator (CMP11), and a second resistor (R25). A first end of the first resistor is connected to the first electrode of the switching element, a second end of the first resistor is connected to a first electrode of the second switch, a second electrode of the second switch is connected to a first end of the second resistor, and a second end of the second resistor is rounded. A first input terminal of the first comparator is connected to the first electrode of the second switch, and a second input terminal of the first comparator is connected to the second electrode of the switching element. The first comparator controls a current flowing to the second switch such that a voltage drop produced at the first resistor (R23) is equalized with a voltage drop produced between the first and second electrodes of the switching element (T11). A voltage drop at the second resistor serves as the first voltage.

A third aspect of the present invention expands the second aspect. A series circuit including a third resistor (R26) and a third switch (T13) is selectively connected in parallel with the second resistor. The current detection circuit employs a first amplification factor when the third switch is activated and a second amplification factor that is greater than the first amplification factor when the third switch is inactivated.

A fourth aspect of the present invention expands the first aspect. The overcurrent protection circuit further has a second comparator (CMP12) to compare the first voltage (V15) supplied to a second input terminal of the second comparator with the second voltage (V14) supplied to a first input terminal of the second comparator, and if the first voltage is above the second voltage, output a voltage to inactivate the switching element. Once the switching element is inactivated and a voltage at the second electrode of the switching element is dropped, (i) a voltage at the first input terminal of the second comparator is maintained at a predetermined value or higher and (ii) the second comparator outputs a voltage capable of activating the switching element.

A fifth aspect of the present invention expands the third aspect. When the switching element (T11) is started, the third switch (T13) is activated for a predetermined period ($\tau 1$) to generate the first voltage (V5) with the first amplification factor. When a normal transient current flows to the load, the first voltage (V15) does not exceed the second voltage (V14).

A sixth aspect of the present invention extends the fifth aspect. After the predetermined period ($\tau 1$) in which the first voltage (V15) is generated with the first amplification factor, the third switch (T13) is rendered inoperative to change the first amplification factor to the second amplification factor. If the first voltage exceeds the second voltage thereafter, the third switch is activated to resume the first amplification factor for the predetermined period ($\tau 1$). If the first voltage is above the second voltage after a predetermined number of repetitions of the amplification factor changing operation, the switching element (T11) is held inoperative state.

BEST MODE FOR CARRYING OUT THE INVENTION

Figure 1:
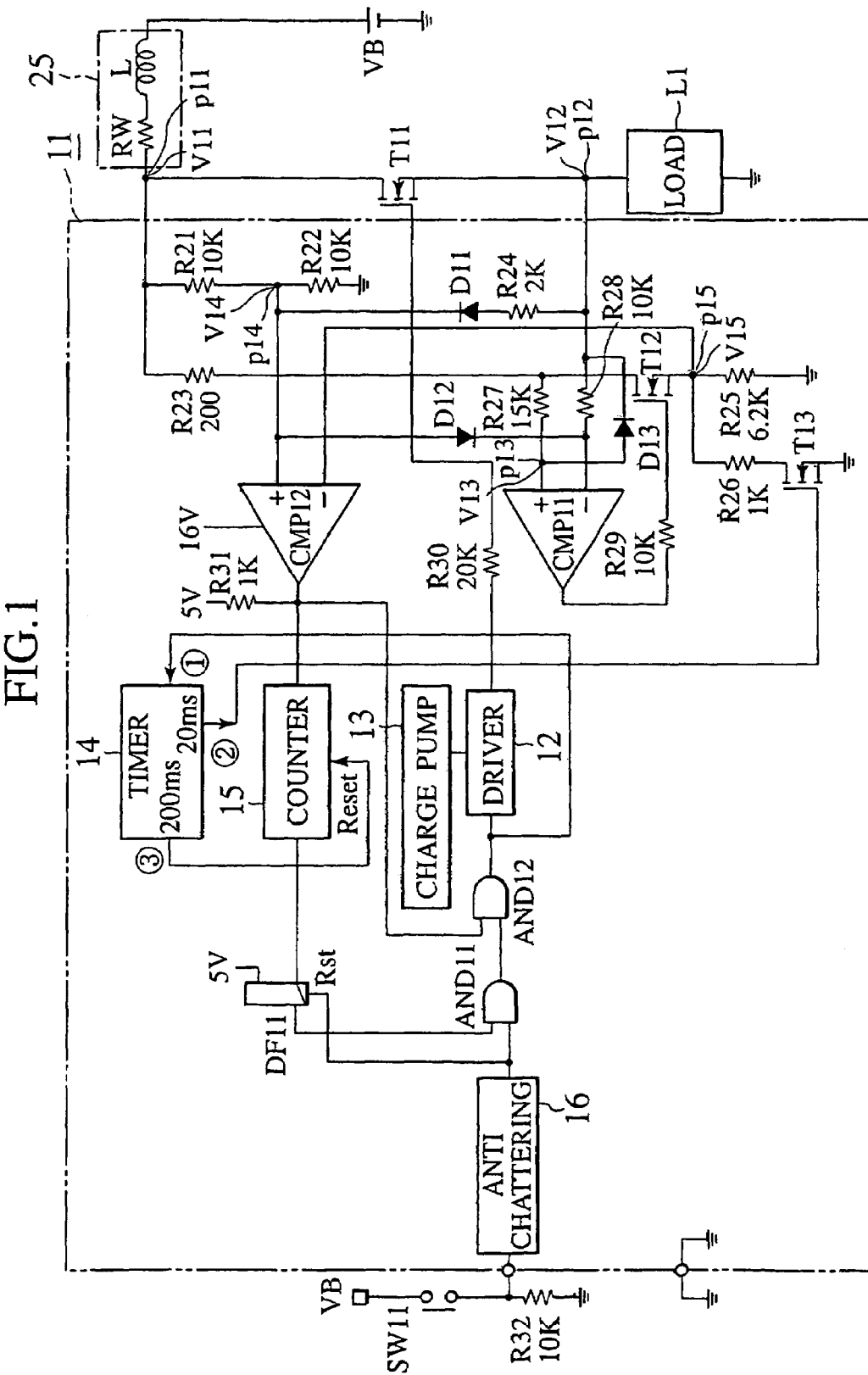
FIG. 1 is a circuit diagram showing an overcurrent detection/protection circuit for a switching element according to a first embodiment of the present invention.

Embodiments of the present invention will be explained with reference to the accompanying drawings. FIG. 1 is a circuit diagram showing an overcurrent detection/protection circuit for a semiconductor element according to a first embodiment of the present invention, and FIGS. 2 to 4 explain operational principles of the first embodiment.

Figure 2:
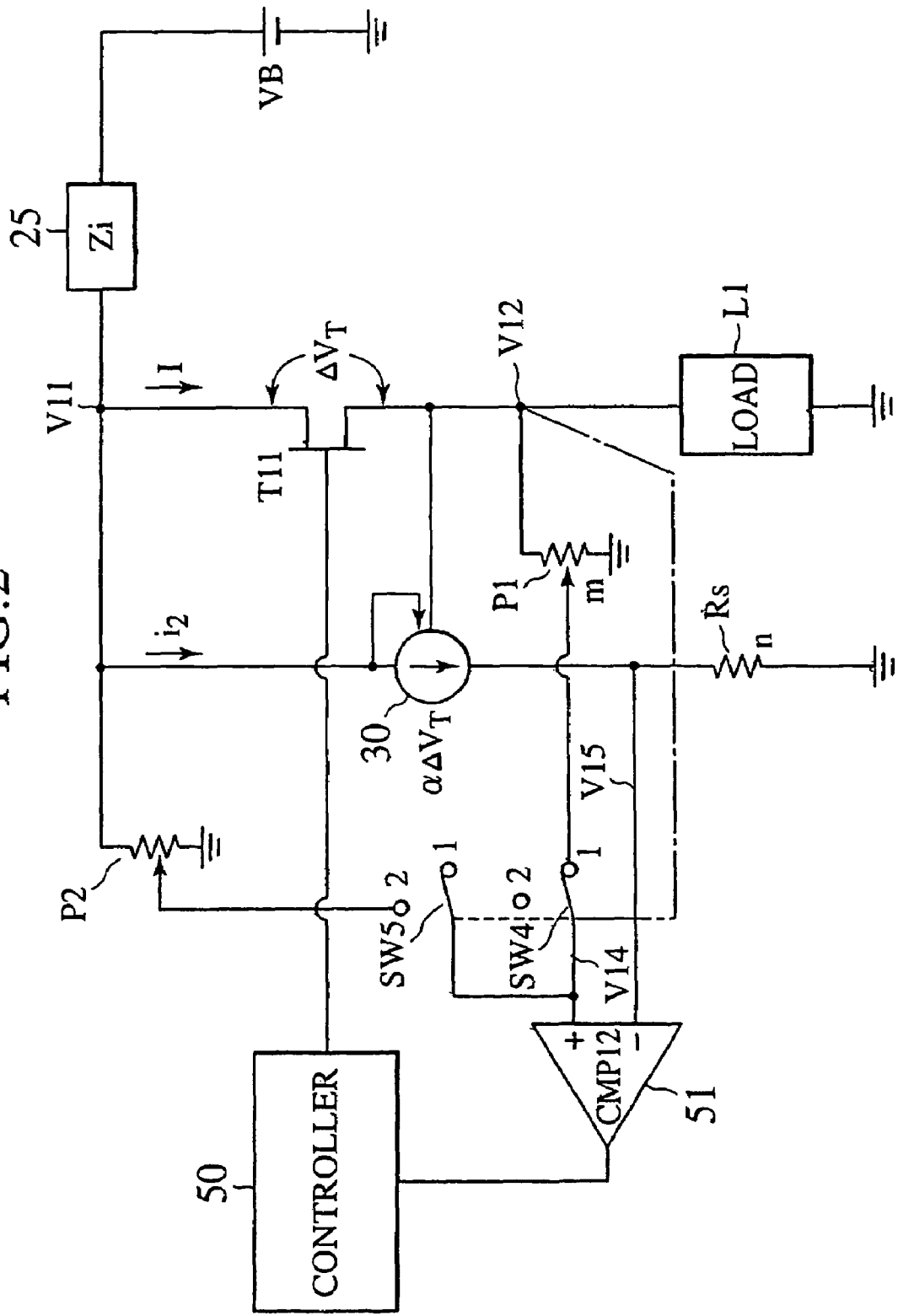
FIG. 2 shows an operational principle of the first embodiment.
Figure 3:
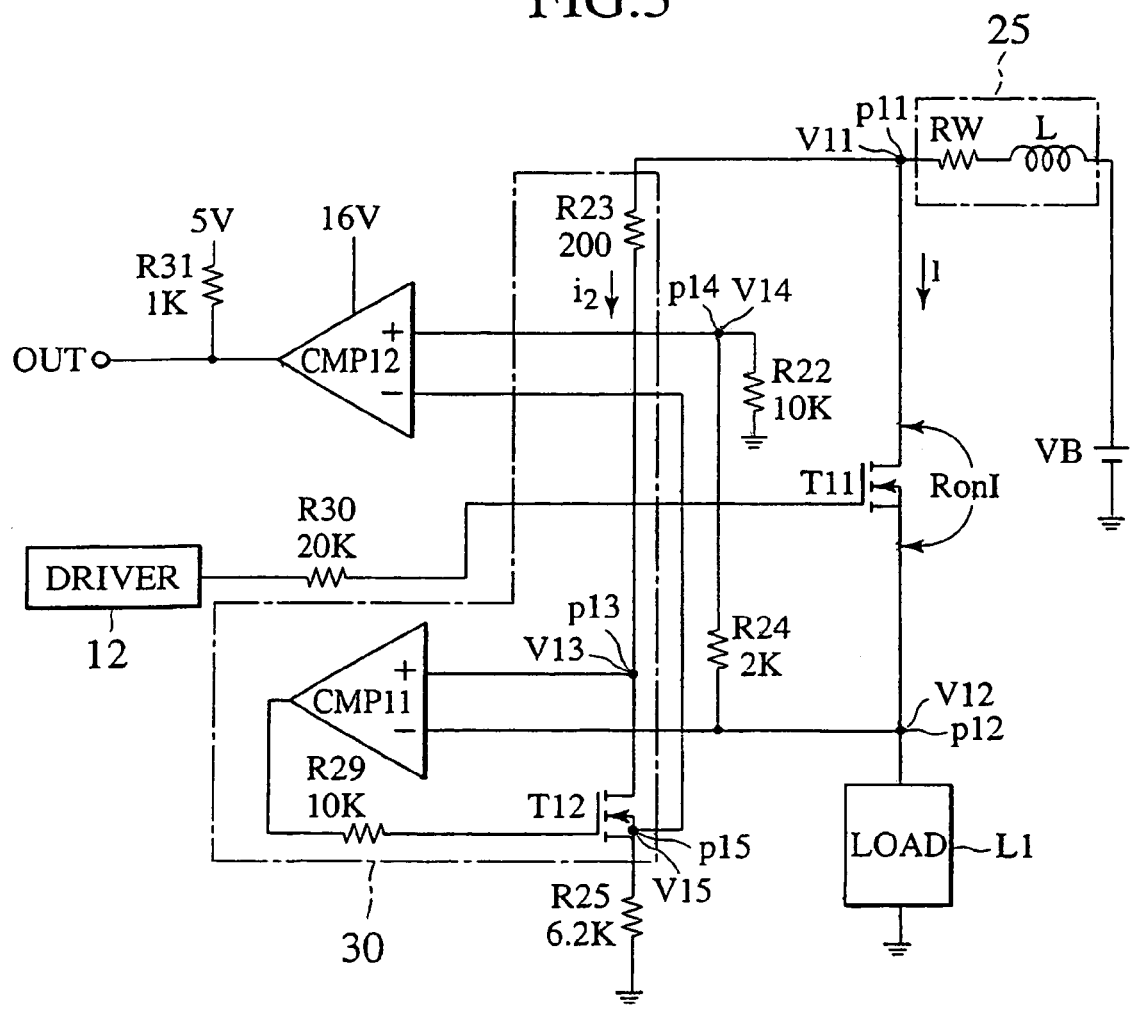
FIG. 3 is a circuit diagram showing an operation of breaking an overcurrent flowing to a switching element (power transistor) according to the first embodiment.

FIG. 2 shows an operational principle of controlling a switch T11 such as a semiconductor element to stop an overcurrent, and FIG. 3 is a circuit diagram showing a basic operation of the first embodiment. A power source VB is connected to a load L1 (impedance ZL) through the switching element T11. A wiring between the power source VB and the switching element T11 involves an internal impedance Zi which is caused by a resistance and a inductance of the wiring, and amount of which depends on a length and a diameter of the wiring. A current I supplied to the load L1 is detected by a current detection circuit without a shunt resistor. The switching element T11 has an ON resistance Ron. A voltage drop $\Delta V_T$ between electrodes of the switching element T11 is expressed as $\Delta V_T = Ron \cdot I$. A current source 30 is a voltage-controlled current source to supply a current proportional to a voltage produced by the ON resistance Ron. The current source 30 has an amplification factor a that is dependent on a resistance R23 (FIG. 3) and is expressed as $\alpha = 1/R23$. The current source 30 supplies a current i2 ($=\alpha \cdot Ron \cdot I$) to an amplifying resistor Rs (R25 or R26 of FIG. 1) to generate a voltage V15 ($=i2 \cdot Rs$) proportional to the current I. The current source 30 and resistor Rs form the current detection circuit. A second electrode of the switching element T11 is connected to the load L1 and provides a voltage V12. The voltage V12 is passed through a potentiometer P1 (R22 and R24 in FIG. 3) to provide a voltage V14. The voltage V12 is influenced by an inductance component L in the internal impedance Zi, and therefore, involves a current changing rate in such as $L \cdot dI/dt$, which will be explained later.

If an overcurrent flows, the voltage V15 increases and the voltage V12 decreases. A comparator CMP12 compares the voltage V15 representative of the current i2 with the voltage V14 representative of the voltage V12. If the voltage V15 is above the voltage V14, it is determined that there is an overcurrent, and a controller 50 (including a driver 12) controls the switching element T11 under predetermined conditions and breaks a load current.

An operational principle of the first embodiment will be explained in detail with reference to FIGS. 3 and 4. In FIG. 3, the switching element T11 is between the power source VB and the load L1 and is rendered operative and inoperative to supply and stop a source voltage to the load L1. The switch T11 may be a semiconductor switching element such as a MOSFET and an IGBT.

A positive output end of the power source VB is connected to the switching element T11 through a conductor 25 having the internal impedance Zi, which is typically composed of a wiring resistance Rw and a wiring inductance L. A node p11 between the conductor 25 and a first electrode of the switching element T11 is grounded through a first resistor R23, a second switch T12 (for example, a semiconductor switching element such as an n-type MOSFET), and a second resistor R25. A first electrode of the second switch T12 is connected to the resistor R23, and a second electrode of the second switch T12 is connected to the resistor R25. The resistor R23, the second switch T12 (including a control element CMP11), the resistor R25, and a resistor R26 (FIG. 4) form a voltage amplification circuit.

A node p15 between the second switch T12 and the resistor R25 is connected to an inverting input terminal of the second comparator CMP12. A node p13 between the resistor R23 and the second switch T12 is connected to a non-inverting input terminal of the first comparator CMP11. The comparator CMP11 is a differential amplifier such as an operational amplifier. An output terminal of the comparator CMP11 is connected to a control terminal (gate) of the second switch T12 through a resistor R29.

A node p12 between the switching element T11 and the load L1 is a current detection point and is connected to an inverting input terminal of the comparator CMP11. The node p12 is grounded through a fourth resistor R24 and a fifth resistor R22, to form the potentiometer P1. A node p14 between the resistors R22 and R24 is connected to a non-inverting input terminal of the comparator CMP12. The comparator CMP12 is an ordinary comparator with an open collector. An output terminal of the comparator CMP12 is connected to a 5V power source through a pull-up resistor R31. The control terminal (gate) of the switching element T11 is connected to the driver 12 through a resistor R30.

An operation of the circuit of FIG. 3 will be explained. In FIG. 3, VB is a power source voltage, I a circuit current (including an overcurrent), i2 an auxiliary current (current source) to detect the circuit current I, Rw a wiring resistance contained in the internal impedance (wiring impedance) Zi and calculable by subtracting a resistance (Ron+wiring resistance) between the power source terminal of the switching element T11 and a ground level from a total resistance (including power source internal resistance) up to the load L1, L an inductance (wiring inductance) contained in the internal impedance Zi, and Ron the ON resistance of the switching element T11. In FIG. 3, major nodes are provided with voltage values (for example, the node p11 has a voltage value V11). The voltage V14 is referred to as the second voltage, and the voltage V15 as the first voltage.

In FIG. 3, the internal impedance Zi of the wiring 25 involves the wiring resistance Rw and wiring inductance L. This does not limit the present invention. The wiring 25 may involve other impedance factors.

Voltage Conversion and Amplification of Circuit Current

When the switching element T11 is activated, it passes the circuit current I, which causes a voltage drop of $\Delta V_T = V11 - V12$ ($=Ron \cdot I$). The voltage V12 at the node p12 is supplied to the inverting input terminal of the comparator CMP11, and a voltage V13 at the node p13 is supplied to the non-inverting input terminal of the comparator CMP11. If the voltage V13 is above the voltage V12, the comparator CMP11 provides a high-level output.

And a control terminal voltage (gate voltage $V_{GS}$) of the second switch T12 is increased, thereby the second switch T12 is activated. This permits to increase in a current flowing through a series circuit consisting of the resistor R23, second switch T12, and resistor R25. Then a voltage drop at the resistor R23 is increased, and the voltage V13 is decreased. As a result, the voltage V13 is controlled to be equal to the voltage V12.

If the voltage V13 is below the voltage V12, the comparator CMP11 provides a low-level output to decrease the control voltage of the second switch T12, thereby rendering the switch T12 inoperative. This decreases a current flowing through the resistor R23, to increase the voltage V13. As a result, the voltage V13 is controlled to be equal to the voltage V12. In this way, the voltage V13 at the node p13 is always regulated so as to satisfy V13=V12. The current i2 flowing through the resistor R23 is expressed as i2=(V11−V13)/R23=(V11−V12)/R23. The term (V11−V12) is the voltage drop $\Delta V_T$ between the first and second electrodes of the switching element T11. The current i2 ($=\Delta V_T/R23$) proportional to the voltage drop $\Delta V_T$ is supplied to the resistor R25. If a parameter n is defined by n≡R25/R23, the first voltage V15 at the node p15 will be as follows:

$$V15 = R25 \cdot i2 = (V11-V12) \cdot n = n \cdot \text{Ron} \cdot I \qquad (1).$$

Accordingly, the circuit current I is converted into the voltage Ron·I by the ON resistance Ron of the switching element T11, and the converted voltage is amplified by a parameter n at the ends of the resistor R25. Accordingly, the parameter n is an amplification factor to detect the current I. The resistor R23, the second switch T12, the comparator CMP11, and the resistor R29 form the voltage-controlled current source 30 to supply the current i2 proportional to the voltage $\Delta V_T$. If the resistors R23 and R25 are 200Ω and 6.2 kΩ, respectively, the amplification factor n is 31.

Determination of Overcurrent

Whether or not an overcurrent flows to the switching element T11 is determined by the comparator CMP12. In FIG. 3, the inverting input terminal of the comparator CMP12 receives the first voltage V15 proportional to the circuit current I and the non-inverting input terminal thereof receives the second voltage V14 obtained by dividing the voltage V12 by the resistors R22 and R24. The voltage V14 serves as a reference voltage to sense an overcurrent. Accordingly, the voltage V15 corresponding to the circuit current I is checked to see if it exceeds the voltage V14, thereby determining whether or not the circuit current I excesses a predetermined value. If a parameter m is defined as m≡R22/(R24+R22), then V14=m·V12. The resistors R22 and R24 form the potentiometer P1 to provide the voltage V14 proportional to the voltage V12.

The voltage V12 is expressed with the source voltage VB, wiring resistance Rw, wiring inductance L, ON resistance Ron of the switching element T11, and circuit current I as follows:

$$V12 = VB - (Rw+\text{Ron}) \cdot I - L \cdot dI/dt,$$

$$V14 = m \cdot V12 = m \cdot \{VB - (Rw+\text{Ron}) \cdot I - L \cdot dI/dt\} \qquad (2).$$

From the expression (2), it is understood that the voltage V14 used to sense an overcurrent is variable. The voltage V14 decreases as the circuit current I increases, or as an increasing rate of the circuit current I increases. As a result, the voltage V14 is effective to surely and easily detect occurrence of an overcurrent. The voltage V15 increases as the circuit current I increases. On the contrary, the voltage V14 decreases as the circuit current I increases. In this way, the present invention achieves an amplifying effect on an increase or a transient change in the circuit current. Such an amplifying effect is called a compression effect on the reference voltage used to determine an overcurrent.

The voltages V14 and V15 compared with each other by the comparator CMP12 provide a voltage difference $\Delta Vc \equiv V14-V15$, which is expressed as follows from the expressions (1) and (2):

$$\Delta Vc = m \cdot VB - \{m \cdot Rw + (n+m) \cdot \text{Ron}\} \cdot I - m \cdot L \cdot dI/dt \qquad (2').$$

In the expression (2'), the second term of the right side shows that a level change in the circuit current I is surely detectable due to synergy effect between the amplifying effect of the parameter n and the compression effect of the parameter m. The third term of the right side shows, that a changing rate of the circuit current I is detectable according to the compression effect of the parameter m. It must be noted that none of the expressions (2) and (2') involves the impedance (resistance) of the load L1. Accordingly, the present invention can detect a circuit current without shunt resistors and without using the load L1 as a shunt resistor.

When the first voltage V15 exceeds the second voltage V14 to provide $\Delta Vc<0$, the output of the comparator CMP12 changes to low. As a result, the driver 12 provides a ground-level output to render the switching element T11 inoperative.

When the switching element T11 is rendered inoperative, the voltage V12 drops to the ground level. Accordingly, the voltage at the second electrode of the switching element T11 drops below a predetermined value, and the voltage at the node p14 to the non-inverting input terminal of the comparator CMP12 becomes null. As a result, the comparator CMP12 provides a low-level output. At this time, the driver 12 is inoperative, as will be explained later. Under this state, it is impossible to again activate the switching element T11 according to a switch control circuit of FIG. 1. The switching element T11, however, must be restarted as will be explained below.

Circuit for Activating Switching Element

FIG. 2 shows a concept of activating the switch T11 which is rendered inoperative. When the switch T11 is rendered inoperative, a voltage drop in V12 is detected (by a diode D13 of FIG. 4), the current from the current source 30 is broken (i.e. high-impedance output), and the voltage V15 drops to the ground level. In response to the voltage drop in V12, a fourth switch SW4 (a diode D11 of FIG. 4) that is normally ON (terminal 1) is turned off (terminal 2), a fifth switch SW5 (a diode D12 of FIG. 4) that is normally OFF (terminal 1) is turned on (terminal 2), and a connection to the non-inverting input terminal of the comparator CMP12 is switched from the potentiometer P1 to a potentiometer P2 (resistors R21, R22, and R28 of FIG. 4). Receiving an output voltage of the potentiometer P2 at the non-inverting input terminal, the comparator CMP12 provides a high-level output to again renders the switch T11 operative through the controller 50. If the controller 50 is constituted to alone activate the switch T11, the fourth switch SW4, fifth switch SW5, and potentiometer P2 are not necessary for the overcurrent protection circuit.

Figure 4:
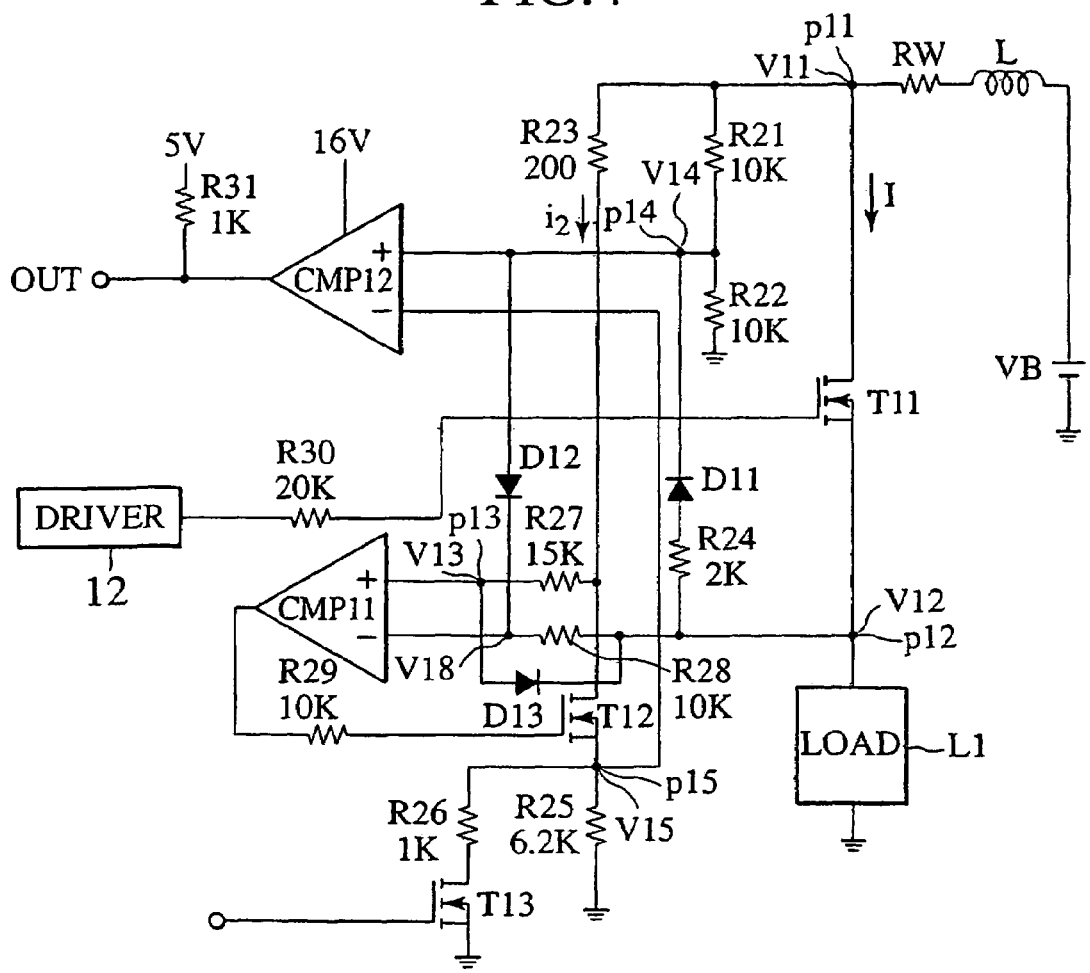
FIG. 4 is a circuit diagram showing an operation of activating the power transistor after the breaking of an overcurrent according to the first embodiment.

FIG. 4 shows a circuit to realize the above-mentioned operation. In addition to the circuit of FIG. 3, the circuit of FIG. 4 has elements to restart the switching element T11, such as a third switch T13, the diodes D11 to D13 serving as rectifiers, and the resistors R21, R26, R27, and R28. In parallel with the resistor R25, the third resistor R26 and third switch T13 are arranged. The diode D13 is arranged between nodes p13 and p12. The diode D11 is arranged between the node p14 and the resistor R24. The diode D12 is arranged between the node p14 and the inverting input terminal of the comparator CMP11.

The sixth resistor R21 is arranged between the resistor R22 and the node p11. The seventh and eighth resistors R27 and R28 are connected to the two input terminals of the comparator CMP 11, respectively.

If the switching element T11 shows high impedance and is inoperative in FIG. 4, the diode D13 is rendered operative. As a result, the voltage V13 to the non-inverting input terminal of the comparator CMP11 is clamped at the ground level through the load L1. Load resistance is small relative to the resistor R27 (whose resistance is 15 kΩ as will be explained later), and therefore, the voltage V13 is decreased by a forward voltage drop (about 0.7 V in a silicon diode) of the diode D13.

On the other hand, a voltage V18 to the inverting input terminal of the comparator CMP11 does not drop below a voltage V18min due to the diodes D11 and D12 and the resistors R21 and R28, even if the voltage V12 drops to the ground level.

$$V18min = R22 \cdot (R28 \cdot VB + R21 \cdot Vd)/(R21 \cdot R22 + R21 \cdot R28 + R22 \cdot R28) - Vd \quad (3),$$

where Vd is a forward voltage of each diode. The voltage V18min is generated by dividing the source voltage VB (or V11) by the resistor R21 and the parallel resistors R22 and R28 forming the potentiometer P2. The output of the potentiometer P2 is a sum of the voltage V18min and the forward voltage of the diode D12.

If the switching element T11 is rendered operative, the diode D12 serving as the fifth switch is inoperative(OFF), the diode D11 serving as the fourth switch is operative(ON), and the potentiometer P1 is connected to the inverting input terminal of the comparator CMP11. If the switching element T11 is rendered inoperative, the diode D11 is inoperative (OFF), the diode D12 is operative(ON), and the potentiometer P2 is connected to the inverting input terminal of the comparator CMP11. The expression (3) can be also written as follows:

$$V18min = R22 \cdot R28 \cdot VB\{1-(1+R21/R22)(Vd/VB)\}/\{R21(R22+R28)+R22 \cdot R28\} \quad (3')$$

In the numerator of the expression (3'), because of Vd/VB<<1, the voltage V18min is greater than zero. If R21=R22=R28=10 kΩ in the expression (3), then R24=2 kΩ, Vd=0.7 V, and VB=12.5 V. As a result, the value of the expression (3) will be 3.7 V.

If the switching element T11 is inoperative and the terminal voltage V12 of the load L1 is at the ground level, a bias current flows through the resistor R21, diode D12, and resistor R28. As a result, the voltage V18 to the inverting input terminal of the comparator CMP11 is higher than the voltage V13 to the non-inverting input terminal thereof. Then, the comparator CMP11 provides a low-level output to turn off the second switch T12. Consequently, the voltage V15 to the inverting input terminal of the comparator CMP12 drops close to the ground level.

On the other hand, the voltage V14 to the non-inverting input terminal of the comparator CMP12 is higher than the voltage of the expression (3) by a forward voltage drop of the diode D12. More precisely, the voltage V14 is about 4.4 V in the example of FIG. 4. As a result, the comparator CMP12 provides a high-level output to make the switching element T11 ready for activation. As will be explained later, the switching element T11 can be activated if the output of the comparator CMP12 is high.

If the switching element T11 is changed from operative state to inoperative state, the voltage V12 will decrease and the voltage V13 (=V12+0.7 V) at the node p13 to the non-inverting input terminal of the comparator CMP11 will decrease below the voltage of the expression (3). Even in this state, the switching element T11 can be activated if receiving a drive signal, i.e., if a switch SW11 of FIG. 1 is ON. The switch SW11 will be explained later.

Changing Amplification Factor

According to the present invention, the amplification factor n in the expression (1) is variable. For example, the amplification factor n can be changed between two values. This is to detect an overcurrent in two stages as will be explained later. Changing the amplification factor n will be explained.

To change the amplification factor n in FIG. 4, a series circuit consisting of the resistor R26 and third switch T13 is connected in parallel with the resistor R25. When the third switch T13 is operative, a resistance value between the node p15 and the ground changes from R25 with the third switch T13 being inoperative to a combined resistance value of R25·R26/(R25+R26)=R25/(1+R25/R26). That is, the combined resistance value is lower than R25. As a result, activating the third switch T13 reduces the amplification factor n from R25/R23 (=n2) to R25·R26/{(R25+R26) R23}=R25/{R23(1+R25/R26)} (=n1).

When the third switch T13 is activated, a first amplification factor n1 (small) is provided, and when the third switch T13 is inoperative, a second amplification factor n2 (n1<n2) is provided. By adjusting the value of the resistor R26, the first amplification factor n1 can optionally be set.

Overcurrent Determining Reference Voltage

The reference voltage used to determine an overcurrent will be explained. In FIG. 4, an overcurrent determining reference voltage V14' with the switching element T11 being operative is as follows:

$$V14' = (V11 \cdot R22 \cdot R24 + V12 \cdot R21 \cdot R22 - Vd \cdot R21 \cdot R22)/(R21 \cdot R22 + R21 \cdot R24 + R22 \cdot R24) \quad (4).$$

If V11=12.5 V and V12=12 V, then the expression (4) provides 9.9 V. The reference voltage V14' is generated by dividing the voltage VB (or V11) by the resistor R21 and the parallel resistors R22 and R24 (including diode D11). These resistors form the potentiometer P1, and therefore, the voltage V14' is the output of the potentiometer P1. The expression (4) can be rewritten as follows:

$$V14' = m'' \cdot V11 + m' \cdot V12 - m' \cdot Vd$$

where, $$m'' = R22/\{R22 + R21 \cdot (1 + R22/R24)\}, \text{ and}$$

$$m' = R22/\{R22 + R24 \cdot (1 + R22/R21)\}. \quad (4')$$

The coefficient m' for the voltage V12 is obtained by correcting the amplification factor m of the expression (2) with the resistor R21. The voltages V11 and V12 in the expression (4) are as follows:

$$V11 = VB - Rw \cdot I - L \cdot dI/dt \quad (5).$$

$$V12 = VB - (Rw + Ron) \cdot I - L \cdot dI/dt \quad (6).$$

The expressions (4) and (4') show that the voltage V14' increases as the voltages V11 and V12 increase. To increase the influence (m') of the voltage V12 on the reference voltage V14' greater than the influence (m'') of the voltage V11 on the same, the first embodiment sets the coefficient R21·R22 for the voltage V12 greater than the coefficient R22·R24 for the voltage V11. In FIG. 4, R21=10 kΩ and R24=2 kΩ, and therefore, the coefficient m' for the voltage V12 is five times greater than the coefficient m″ for the voltage V11. As a result, the reference voltage V14′ is more influenced by the voltage V12 than the voltage V11, and therefore, the behavior of the reference voltage V14′ can be estimated by considering only the item concerning the voltage V12 and by replacing m′ with m. The reference voltage V14′ may be approximated with the voltage V14 of the expression (2).

If the third switch T13 is inoperative, the first voltage V15 is generated with the second amplification factor n2. In this case, an overcurrent is sensed if the voltage V15 is above the value provided by the expression (4). In the example of FIG. 4, an overcurrent is sensed if the first voltage V15 exceeds 9.9 V. A circuit current I11 corresponding to the first voltage V15 of 9.9 V is as follows if Ron=40 mΩ:

$$I11 = V14 \cdot R23/R25/Ron \quad (7)$$
$$= 9.9V \cdot 200\Omega/6.2\,k\Omega/40\,m\Omega$$
$$= 8A.$$

When the first voltage V15 is based on the second amplification factor n2 in FIG. 4, a circuit current above 8 A is detected as an overcurrent.

If Rw=50 mΩ, then (Rw+Ron)·I=(50 mΩ+40 mΩ)·8 A=0.7 V. While a small overcurrent is being detected, an increasing rate of the circuit current is small, and therefore, L·dI/dt≈0. In the overcurrent determination with the first voltage V15 being generated with the second amplification factor n2 (the third switch T13 being inoperative), substantially no compression effect (the lowering of the reference voltage V14 due to the wiring inductance L) works on the reference voltage. At this time, the accuracy of the overcurrent determination is determined by the accuracy of the ON resistance Ron of the switching element T11.

Compression Effect on Overcurrent Determining Reference Voltage

If an overcurrent is detected with the first voltage V15 being generated with the first amplification factor n1 (the third switch T13 being active), the compression effect acts on the reference voltage.

If the reference voltage V14′ keeps 9.9 V without the compression effect, a circuit current I12 to be determined as an overcurrent is expressed as follows with the resistance R25 of the expression (1) being replaced with the parallel resistance of R25 and R26:

$$I12 = V14 \cdot R23 \cdot (R25+R26)/(R25 \cdot R26)/Ron \quad (8).$$

$$I12 = 9.9\ V \cdot 200\Omega \cdot (6.2\,k\Omega+1\,k\Omega)/(6.2\,k\Omega \cdot 1\,k\Omega)/40\,m\Omega = 57.5\ A \quad (8').$$

If an overcurrent flows when the first voltage V15 is generated with the first amplification factor n1, the circuit current steeply rises. In FIG. 4, L≈2.5 µH and dI/dt≈1.25 A/µs, and therefore, L·dI/dt=3.1 V. This is counter electromotive force to drop the voltages V11 and V12. If m=9.9 V/12 V=0.83, then a compression quantity ΔV1 (a decrease in the second voltage V14 due to an increasing rate of the circuit current) on the reference voltage due to the circuit inductance L is as follows:

$$\Delta V1 = m \cdot L \cdot dI/dt = 0.83 \cdot 3.1\ V = 2.57\ V \quad (9).$$

The voltage of 2.57 V corresponds to a circuit current of 15 A. When a circuit current flows through the wiring resistance Rw, the voltages V11 and V12 decrease. This effect is ΔV2≡m·I·(Rw+Ron). When a circuit current flows through the ON resistance Ron of the switching element T11, only the voltage V12 decreases.

As explained above, the influence of the voltage V12 on the reference voltage V14 (second voltage) is about five times greater than the influence of the voltage V11 on the same. Accordingly, the voltage V14 of the expression (8) is replaced with V14′≡V14−ΔV1−ΔV2, and a circuit current I1 to be determined as an overcurrent is estimated as follows:

$$V14 - \Delta V1 - m \cdot I1 \cdot (Rw+Ron) = I1 \cdot Ron \cdot (R25 \cdot R26)/(R25+R26)/R23 \quad (10).$$

This can be rewritten as follows:

$$\{1+m \cdot (Rw+Ron) \cdot R23 \cdot (R25+R26)/Ron/(R25 \cdot R26)\} \cdot I1 = R23 \cdot (R25+R26)/Ron/(R25 \cdot R26) \cdot (V14-\Delta V1) \quad (11).$$

The expression (11) is solved for the current I1 according to the above-mentioned circuit constants, to obtain I1=29.7 A. Compared with no compression effect on the reference voltage V14 (second voltage), the compression effect compresses the reference voltage by 57.5 A−29.7 A=27.8 A, which is about 48% of the value without the compression effect. The compressed portion corresponds to a third voltage.

Even if a wiring failure such as a dead short to cause a large overcurrent occurs, the present invention compresses the reference voltage, to speedily inactivate the semiconductor switching element T11 and prevent the breakdown of the wiring and switching element T11.

The operation of the first embodiment will be explained in detail.

(i) Basic Operation

In FIG. 3, a voltage (voltage drop) at the terminals of the semiconductor switching element T11 (power transistor) is amplified to the first voltage V15. The voltage V12 between the load-side terminal of the switching element T11 and the ground is divided to provide the second voltage V14. The voltage V15 is compared with the voltage V14. If the voltage V15 is above the voltage V14, it is determined that the current I flowing through the switching element T11 is an overcurrent, and the switching element T11 is rendered inoperative.

(ii) First Amplification Factor

Just after the activation of the switching element T11, a normal transient current (rush current) flows to the load L1. To avoid the normal transient current from being sensed as an overcurrent, a low amplification factor, i.e., the first amplification factor n1 is set for the first voltage V15 for a predetermined period τ1 after the activation of the switching element T11.

(iii) Second Amplification Factor and Start Operation

When the period τ1 passes after the start of the switching element T11, the amplification factor applied to the first voltage V15 is changed from the first amplification factor n1 to the second amplification factor n2 that is greater than the first amplification factor n1.

The duration of the normal transient current differs depending on the load L1, and therefore, the period τ1 may be extendable for a predetermined number of times. More precisely, after the period τ1 of the first time, the second amplification factor n2 is set. If an overcurrent is detected at this time, the switching element T11 is once rendered inoperative and is quickly activated. This resumes the first amplification factor n1 and keeps it for the period τ1 of the second time. The operation of resuming the first amplification factor n1 is repeated a predetermined number of times (N1). After the N1 repetitions of this operation, the second amplification factor n2 is resumed. If an overcurrent is still detected at this time, the switching element T11 is rendered inoperative, and the inoperative state is continued. Accordingly, if no overcurrent is detected within the period of τ1·N1, the switching element T11 will continuously be operative. This prevents the disconnection of the circuit due to a rush current generated when the power source is started.

(iv) Occurrence of Overcurrent

If a wiring abnormality occurs between the switching element T11 and the load L1 when a normal current is flowing to the load L1, an overcurrent will be produced. If the wiring abnormality is a layer short, that is, if an overcurrent is not so large that the second amplification factor n2 will detect an overcurrent and the first amplification factor n1 will detect no overcurrent, in this case, the switching element T11 is rendered inoperative after the period of τ1·N1 and the inoperative state is held. While the overcurrent is being detected, the circuit current is substantially unchanged, and therefore, no counter electromotive force will be generated. In the case of the layer short, the overcurrent is relatively small, and the second voltage V14 is dependent on the source voltage VB. And, the second voltage V14 is substantially constant relative to the overcurrent, to show no compression effect.

In this case, an overcurrent determination is based on the magnitude of the first voltage V15. The first voltage V15 increases as the ON resistance Ron of the switching element T11 increases, and therefore, the accuracy of overcurrent detection is influenced by variations in the ON resistance Ron. Generally, the ON resistance of a semiconductor element such as a power transistor involves individual variations and is changeable on temperatures. Employing the ON resistance to detect an overcurrent, therefore, is effective only for an overcurrent that is three to four times greater than a normal current.

(v) First Overcurrent Detection

If an overcurrent is detected with the first amplification factor n1, the switching element T11 is successively turned off and on without waiting for the period τ1. If the overcurrent is detected for a predetermined number (N1) of times, the switching element T11 is rendered inoperative and the inoperative state is maintained. It is also possible to hold the switching element T11 inoperative once an overcurrent is detected with the first amplification factor n1. This will be explained in the second embodiment. If an overcurrent is detected with the first amplification factor n1, the overcurrent greatly differs from a normal current, and therefore, there is a little possibility of erroneous overcurrent determination even if the overcurrent determination is made on the first detection.

(vi) Second Overcurrent Detection

The circuit that passes an overcurrent involves the wiring inductance L, and therefore, the reference second voltage V14 is compressed by counter electromotive force produced by the wiring inductance L when a current suddenly increases. As short-circuit resistance decreases, an overcurrent rises more sharply to increase the degree of compression of the second voltage V14. If a large current flows, the wiring resistance Rw and the ON resistance Ron of the switching element T11 also compress the second voltage V14. These compression effects enable to detect any large overcurrent value.

Accordingly, the first embodiment surely detects an overcurrent caused by relatively large short-circuit resistance (layer short), and at the same time, blocks a large overcurrent caused by relatively small short-circuit resistance (dead short). This is an ideal characteristic for overcurrent detection and protection. Due to the compression effect, the first embodiment surely detects and prevents an overcurrent even if the ON resistance Ron of the semiconductor switching element T11 varies.

In this way, the first embodiment is capable of detecting and blocking any overcurrent from a minor one that is three to four times as large as a normal current (layer-short overcurrent) to a large one caused by a dead short, thereby protecting wiring and semiconductor elements.

Operation of Overcurrent Detection Apparatus

A concrete example of an overcurrent detection apparatus according to the present invention will be explained. FIG. 1 shows an overcurrent detection apparatus 11 according to the first embodiment of the present invention and peripheral devices thereof. The apparatus 11 operates according to the principles explained with reference to FIGS. 2 to 4.

The apparatus 11 has a circuit to activate/inactivate the semiconductor switching element T11, supply/stop the source voltage VB to the load L1, and detect an overcurrent flowing through the semiconductor switching device T11. If an overcurrent flows, the apparatus I1 quickly detects it and cuts a circuit between the power source VB and the load L1 according to the size of the overcurrent, to protect the switching element T11 and the wiring connecting the switching element T11 to the power source VB.

The apparatus 11 includes a power source switch circuit to provide the apparatus 11 with a logic signal representing ON/OFF information on a switch SW11 that starts and stops the load L1. The power source switch circuit includes a resistor R32 connected between the switch SW11 and the ground, and an anti-chattering circuit 16 to prevent the chattering of voltage when the switch SW11 is operated. An output side of the power source switch circuit is connected to AND circuits AND11 and AND12. The apparatus 11 also includes a latch DF11, a charge pump 13, a timer 14, and a counter 15.

The timer 14 includes a first timer to define a first period τ1=20 ms and a second timer to define a second period τ2=200 ms. The counter 15 counts a predetermined number (N1), and when the number is counted, provides a signal to turn off the latch DF11. According to the first embodiment, the predetermined number to be counted is four. The other parts of FIG. 1 are the same as those of FIG. 4, and therefore, will not be explained again.

An operation of the overcurrent detection apparatus 11 at the start of the power source VB will be explained. If the switch SW11 is OFF, the latch DF11 provides a high-level output, and the comparator CMP12 also provides a high-level output.

If the switch SW11 is turned on, the two AND circuits AND11 and AND12 provide each a high-level output, and therefore, the driver 12 provides a high-level signal to activate the switching element T11.

When the AND circuit AND12 provides the high-level output, the first timer of the timer 14 starts to provide, for the period τ1=20 ms, a drive signal for the third switch T13.

When the switching element T11 is activated, the power source voltage VB is supplied to the load L1. At the start of the power source, a rush current flows to the load L1. The third switch T13 is ON due to the drive signal. As a result, the first voltage V15 at the node p15 receives the first amplification factor n1 (small). Even if the rush current occurs, the amplification factor n1 is small to suppress the first voltage V15, which does not exceed the reference voltage (second voltage) V14. Consequently, the comparator CMP12 provides a high-level output, the AND circuit AND12 maintains the high-level output, and the switching element T11 holds the operative state.

After the period τ1 of the first time, the timer 14 stops the drive signal to the control terminal (gate) of the third switch T13. The third switch T13 is rendered inoperative and provides high impedance, and the voltage V15 at the node p15 receives the second amplification factor n2 that is larger than the first amplification factor n1. As a result, the voltage V15 increases. If the voltage V15 is below the second voltage V14, the comparator CMP12 maintains the high-level output, and the switching element T11 maintains the activated state. If the voltage V15 exceeds the second voltage V14, the comparator CMP12 provides a low-level output, the AND circuit AND12 provides a low-level output, the driver 12 stops the drive signal, and the switching element T11 is rendered inoperative.

If the switching element T11 is inoperative, the diode D13 clamps the voltage V13 at the node p13 to about 0.7 V. The voltage V12 at the node p12 is grounded. As shown in the expression (3), the voltage to the inverting input terminal of the comparator CMP11 never decreases below 3.7 V, and therefore, the comparator CMP11 provides a low-level output if the switching element T11 is rendered inoperative.

Then, the first voltage V15 at the node p15 decreases close to the ground level. Accordingly, the first voltage V15 becomes lower than the second voltage V14, and the comparator CMP12 again provides a high-level output. As a result, the driver 12 provides the drive signal to activate the switching element T11. At the same times the first timer of the tinier 14 starts to activate the third switch T13 for the period of τ1=20 ms.

The above-mentioned operation (turning on the third switch T13 for the period τ1 and turning off the same) is repeated N1 (=4) times, and the counter 15 turns off the latch DF11. In this way the above-mentioned operation is repeated four times after the start of the power source, to hold the activated state of the switching element T11 even if a rush current flows to the load L1. The period τ1=20 ms and the number N1=4 in the first embodiment may optionally be set according to a period of normal rush current.

Operation on Layer Short

A layer short is a minor short circuit causing an overcurrent several times greater than a normal current. If a layer short occurs, an overcurrent comparable to the rush current mentioned above continuously flows. Even after four repetitions of the period τ1=20 ms, the overcurrent still flows. In this case, the latch DF11 is turned off, and therefore, the switching element T11 is rendered inoperative. Accordingly, if a layer short occurs and continues longer than a period of 80 ms (20 ms×4), the switching element T11 is rendered inoperative to protect the circuit between the power source VB and the load L1.

If the counter 15 detects no rise (switching to a high level) in the AND circuit AND12 for a period of τ2=200 ms set by the second timer of the timer 14, the counter 15 is reset.

Figure 6:
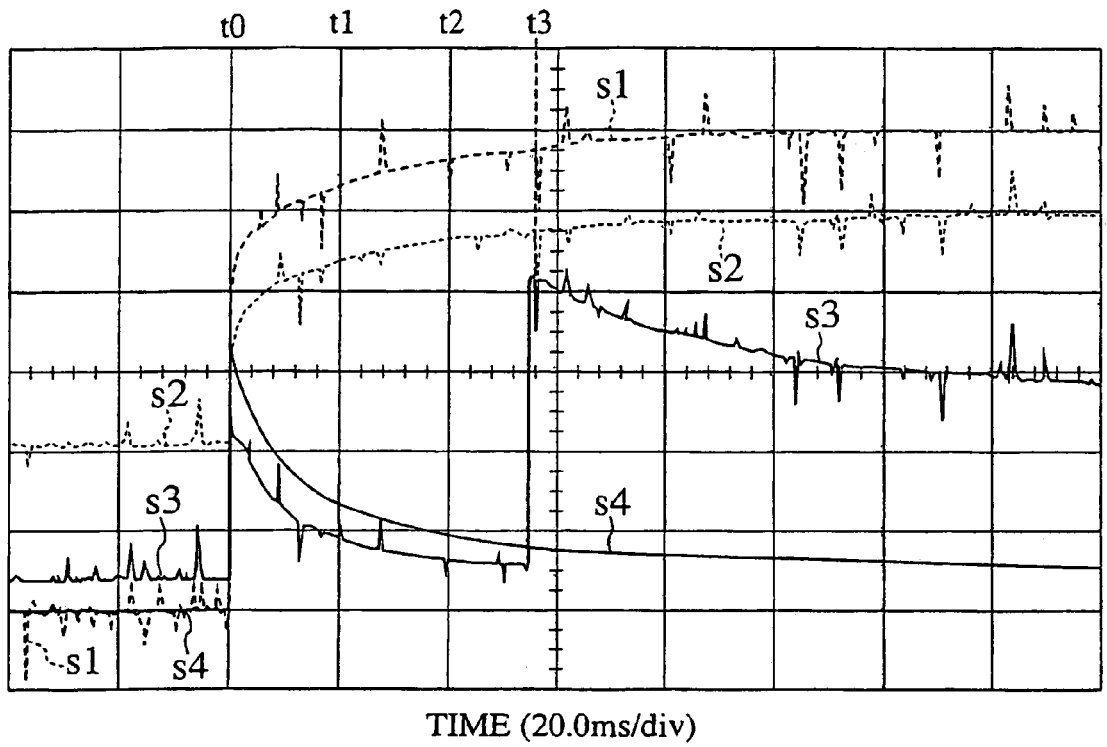
FIG. 6 is a graph showing voltage and current changes in the overcurrent detection/protection circuit of the first embodiment.

FIG. 6 is a graph showing temporal changes in the voltages V12 (curve s1), V14 (curve s2), and V15 (curve s3) and the current I (curve s4) flowing through the switching element T11 when the switch SW11 is turned on.

At time t0, the switch SW11 is turned on, and an overcurrent (rush current) flows to the switching element T11 and load L1. At this time, the third switch T13 becomes operative, and the voltage V15 receives the first amplification factor n1. The voltage V15 (curve s3) is below the voltage V14 (curve s2). When 20 ms passes after the start of the switch SW11, the voltage V15 receives the second amplification factor n2 and exceeds the voltage V14 at time t1. The voltage V15, however, is quickly decreased below the voltage V14. At the time t1 20 ms after the time t0 and at time t2 20 ms after the time t1, the voltage V15 of the curve s3 instantaneously exceeds the voltage V14 of the curve s2 and returns to the original low level. These instantaneous changes of the voltage V15 are not plotted in the graph of FIG. 6.

At time t3, the voltage V15 with the second amplification factor n2 becomes lower than the voltage V14, the comparator CMP12 provides a high-level output, and the switching element T11 is continuously activated. In this way, the switching element T11 is not interrupted by the rush current occurring at the start of the power source and keeps a normal operation.

Operation on Dead Short

An operation when a dead short occurs will be explained. A direct short circuit between, for example, the power source VB and the ground causes a very large overcurrent that suddenly changes a current value. At this time, the wiring inductance L provides the compression effect on the reference voltage (second voltage) V14. And, the second voltage V14 decreases.

At the same time, the overcurrent increases the voltage V15 at the node p15.

As a result, the comparator CMP12 provides a low-level output to render the switching element T11 inoperative. At the same time, the output of the comparator CMP11 is changed to low. Thereafter, the switching element T11 is again activated, and the third switch T13 is activated to enable the first amplification factor n1 that lowers the voltage V15.

At this time, the compression effect lowers the voltage V14, and the overcurrent makes the voltage V15 exceed the voltage V14. Accordingly, even if the third switch T13 is activated to select the lower amplification factor n1, the voltage V15 surely exceeds the voltage V14. Consequently, the counter 15 instantaneously counts four without waiting for the period of 20 ms, to turn off the latch DF11, thereby rendering the switching element T11 inoperative. In this way, the occurrence of a dead short instantaneously renders the switching element T11 inoperative to protect the circuit.

As explained above, the overcurrent detection apparatus 11 according to the first embodiment allows an overcurrent to flow for a given period if the overcurrent is caused by a layer short, and after the given period, cuts the circuit. On the occurrence of a dead short, the first embodiment uses the compression effect provided by a fast increase in the circuit current I, to instantaneously shut down the circuit. In this way, the first embodiment surely protects the circuit.

The compression effect on the reference voltage V14 is effective to surely and quickly break the current irrespective of variations in the ON resistance Ron of the switching element T11.

When the power source VB is started, the first embodiment sets the lower amplification factor n1 for the first voltage V15 for 80 ms (τ1×N1=20 ms×4), to avoid the switching element T11 from being inoperative due to a rush current.

Second Embodiment

Figure 5:
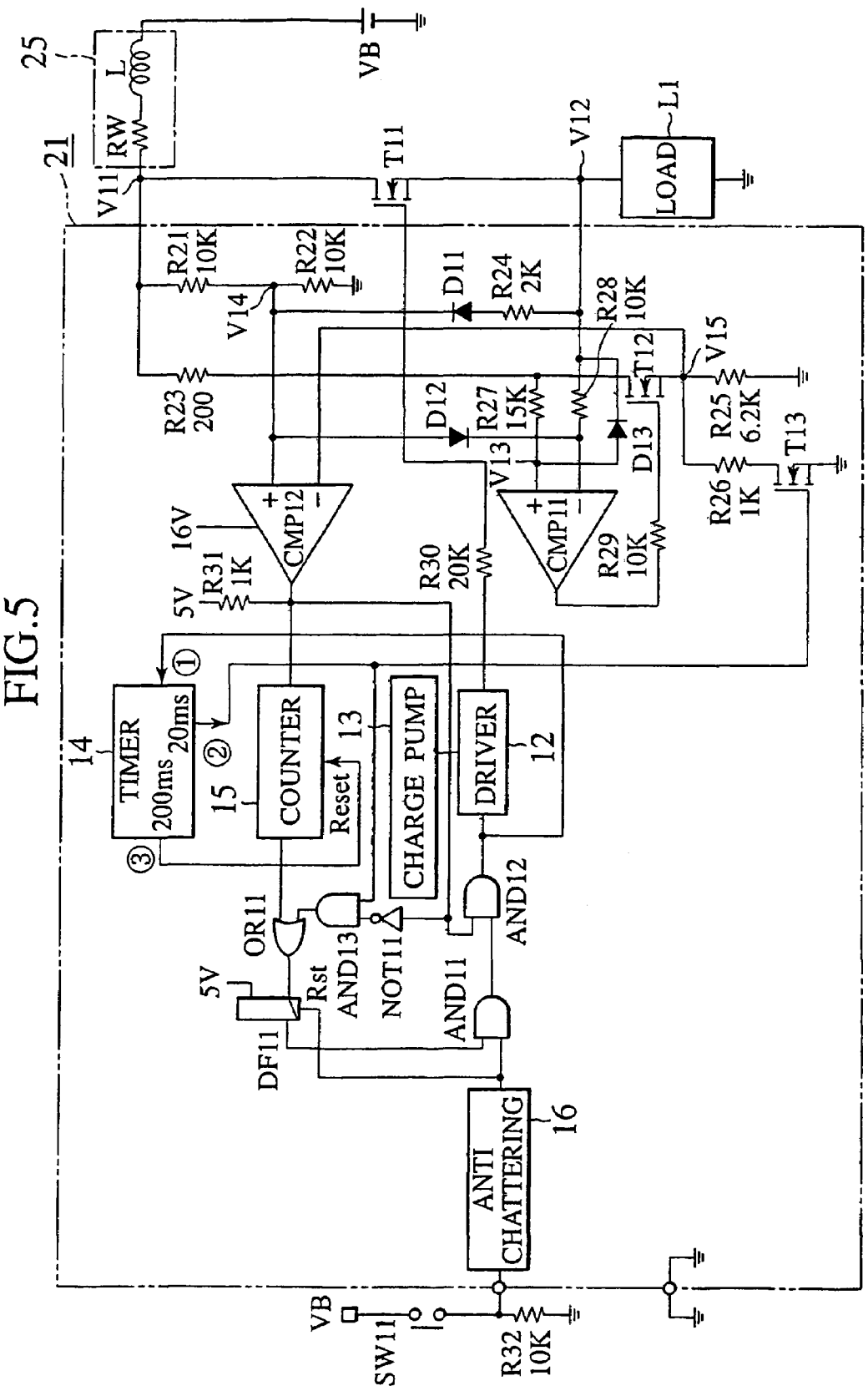
FIG. 5 is a circuit diagram showing an overcurrent detection/protection circuit for a switching element according to a second embodiment of the present invention.

FIG. 5 is a circuit diagram showing an overcurrent detection/protection apparatus 21 according to the second embodiment of the present invention and the peripheral devices thereof. In addition to the structure of the first embodiment, the second embodiment employs an inverter circuit NOT11, an AND circuit AND13, and an OR circuit OR11. The other parts of the second embodiment are the same as those of the first embodiment of FIG. 1.

In FIG. 5, if the output of a comparator CMP12 is low and if a first timer of a timer 14 is active, a latch DF11 is turned off to forcibly inactivate a switching element T11 if the output of the comparator CMP12 is low and if the first timer is active, a circuit between a power source VB and a load L1 is passing an overcurrent due to a dead short. Therefore, the switching element T11 is rendered inoperative at once to protect the circuit without a counter 15 counting four. Compared with the first embodiment, the second embodiment more quickly cuts the circuit when a dead short occurs, thereby quickly protecting the circuit.

Figure 7:
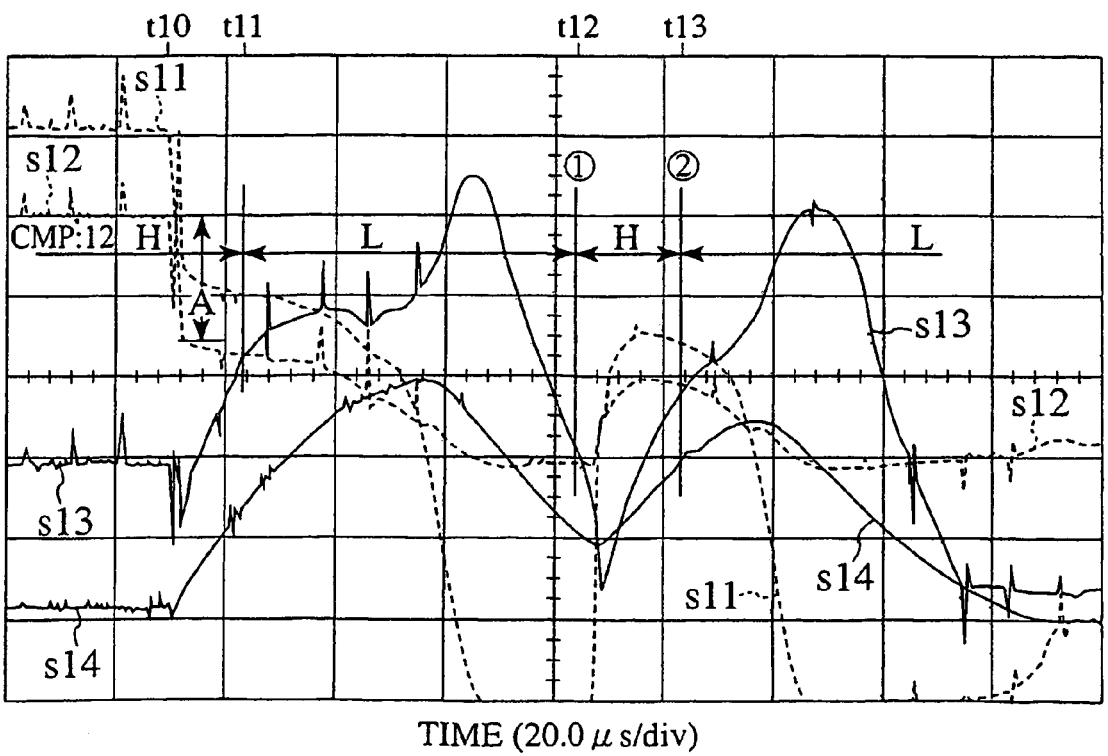
FIG. 7 is a graph showing voltage and current changes in the overcurrent detection/protection circuit of the second embodiment.

FIG. 7 shows the operation of the overcurrent detection/protection apparatus 21 of FIG. 5. For example, two lamp bulbs each of 21 W serving as the load L1 are simultaneously lighted up. At time t10, a dead short (a large short circuit between, for example, the load L1 and the power source VB) occurs. At this time, a voltage V12 changes along a curve s11, a voltage V14 along a curve s12, a voltage V15 along a curve s13, and a current I flowing through the switching element T11 along a curve s14. Unlike the graph of FIG. 6, the graph of FIG. 7 employs a unit time of µs on an abscissa.

When the dead short occurs at time t10, the voltage V15 sharply increases. A voltage "A" is produced by counter electromotive force due to a wiring inductance L. The counter electromotive force provides the compression effect to decrease the voltage V14. At time t11, the voltage V15 exceeds the voltage V14, and the comparator CMP12 provides a low-level output. At time t12, the comparator CMP12 resumes a high-level output.

At time t13, the comparator CMP12 again provides a low-level, output, and a latch DF11 provides a low-level output to inactivate the switching element T11. Accordingly, the dead short instantaneously shuts down and protects the switching element T11.

Effect of Invention

As explained above, the overcurrent detection/protection circuit or apparatus for a semiconductor element according to the present invention amplifies a voltage drop due to a current flowing to the semiconductor element, to generate a first voltage and compares the first voltage with a reference voltage (second voltage). If the first voltage is above the second voltage, the apparatus determines that there is an overcurrent and renders the semiconductor element inoperative. The apparatus surely inactivates the semiconductor element without shunt resistors and without damaging the semiconductor element.

If a current flowing to the semiconductor element suddenly changes, an inductance of wiring connecting the semiconductor element to a power source generates counter electromotive force, which decreases the second voltage. If the current flowing to the semiconductor element further increases, the second voltage is further decreased. If a large short circuit such as a dead short current occurs, the first voltage increases and the second voltage decreases. And, the first voltage quickly exceeds the second voltage, to speedily inactivate the semiconductor element in response to the dead short.

For the first voltage, a first amplification factor and a second amplification factor that is greater than the first amplification factor are set. If a minor overcurrent due to, for example, a layer short occurs, the second amplification factor may sense the overcurrent and the first amplification factor may sense no overcurrent. If the overcurrent is still sensed after N1 times a period τ1, the semiconductor element is rendered inoperative. In this way, the present invention is capable of surely deactivating the semiconductor element in response to a layer short.

If a rush current occurs at the start of a power source, the rush current will settle within N1 times a period τ1, to prevent the semiconductor element from being inoperative due to the rush current.

The invention claimed is:

1. An overcurrent protection circuit for protecting a switching element from an overcurrent, the switching element having a first electrode connected to a power source through a conductor involving an internal impedance and a second electrode connected to a load that is grounded at the other end, the overcurrent protection circuit comprising:
   a current detection circuit to detect a voltage caused by a current flowing through the resistance between the first and second electrodes of the switching element, amplify the detected voltage by an amplification factor, and provide a first voltage corresponding to the current flowing through the switching element; and
   a voltage detection circuit to detect a second voltage generated by dividing a voltage between the second electrode of the switching element and the ground, wherein
   if the first voltage exceeds the second voltage, the overcurrent protection circuit determines that there is an overcurrent and renders the switching element inoperative.

2. An overcurrent protection circuit for protecting a switching element from an overcurrent, the switching element having a first electrode connected to a power source through a conductor involving an internal impedance and a second electrode connected to a load that is grounded at the other end, the overcurrent protection circuit comprising:
   a current detection circuit to detect a voltage caused by a current flowing through the resistance between the first and second electrodes of the switching element, amplify the detected voltage by an amplification factor, and provide a first voltage corresponding to the current flowing through the switching element; and
   a voltage detection circuit to detect a second voltage generated by dividing a voltage that is provided by subtracting a voltage drop due to an overcurrent flowing through an internal impedance of the conductor from the power supply voltage, wherein
   if the first voltage exceeds the second voltage, the overcurrent protection circuit determines that there is an overcurrent and renders the switching element inoperative.

3. The overcurrent protection circuit of any one of claims 1 and 2, wherein:
   the current detection circuit has a first resistor, a second switch, a differential amplifier, and a second resistor;
   a first end of the first resistor is connected to the first electrode of the switching element, a second end of the first resistor is connected to a first electrode of the second switch, a second electrode of the second switch is connected to a first end of the second resistor, and a second end of the second resistor is grounded;
   a non-inverting input terminal of the differential amplifier is connected to the first electrode of the second switch and an inverting input terminal of the differential amplifier is connected to the second electrode of the switching element and an output terminal of the differential amplifier is connected to the control electrode of the second switch;

the differential amplifier controls a current flowing to the second switch such that a voltage drop produced at the first resistor is equalized with a voltage drop produced between the first and second electrodes of the switching element; and a voltage drop at the second resistor serves as the first voltage.

4. The overcurrent protection circuit of claim 3, wherein:

a series circuit including a third resistor and a third switch is selectively connected in parallel with the second resistor; and the current detection circuit employs a first amplification factor when the third switch is rendered operative and a second amplification factor that is greater than the first amplification factor when the third switch is rendered inoperative.

5. The overcurrent protection circuit of anyone of claims 1 and 2, further comprising:

a comparator to compare the first voltage with the second voltage in such a way that the first voltage inputs to an inverting input terminal of the comparator and the second voltage inputs to a non-inverting input terminal of the comparator, wherein the switching element is rendered inoperative when the output voltage of the comparator falls to a low level, and the non-inverting input terminal is held to a predetermined potential even if the potential of the second electrode of the switching element drops to the ground level when it is rendered inoperative so that the potential of the non-inverting input terminal is larger than that of the inverting input terminal, resulting in the output voltage of the comparator being risen to a high level forcibly.

6. The overcurrent protection circuit of claim 5, wherein:

the second electrode of the switching element is connected to a first end of a fourth resistor, a second end of the fourth resistor is connected to an anode of a first diode, a cathode of the first diode is connected to a first end of a fifth resistor, and a second end of the fifth resistor is grounded; and the first electrode of the switching element is connected to a first end of a sixth resistor, a second end of the sixth resistor is connected to the cathode of the first diode, and a node between the cathode of the first diode and the fifth resistor is connected to the non-inverting input terminal.

7. The overcurrent protection circuit of claim 5, wherein:

the current detection circuit has a first resistor, a second switch, a differential amplifier, and a second resistor;

a first end of the first resistor is connected to the first electrode of the switching element, a second end of the first resistor is connected to a first electrode of the second switch, a second electrode of the second switch is connected to a first end of the second resistor, and a second end of the second resistor is grounded;

a non-inverting input terminal of the differential amplifier is connected to the first electrode of the second switch and an inverting input terminal of the differential amplifier is connected to the second electrode of the switching element and an output terminal of the differential amplifier is connected to the control electrode of the second switch;

the differential amplifier controls a current flowing to the second switch such that a voltage drop produced at the first resistor is equalized with a voltage drop produced between the first and second electrodes of the switching element;

a voltage drop at the second resistor serves as the first voltage;

a seventh resistor is inserted between the non-inverting input terminal of the differential amplifier and the first electrode of the second switch;

a second diode is inserted between the non-inverting input terminal of the differential amplifier and the second electrode of the switching element, an anode of the second diode being connected to the non-inverting input terminal of the differential amplifier;

an eighth resistor is inserted between the inverting input terminal of the differential amplifier and the second electrode of the switching element; and a third diode is inserted between the inverting input terminal of the differential amplifier and the non-inverting input terminal of the comparator, an anode of the third diode being connected to the non-inverting input terminal of the comparator.

8. The overcurrent protection circuit of claim 4, wherein:

when the switching element is rendered operative, the third switch is rendered operative for a predetermined period to generate the first voltage with the first amplification factor; and thereby when a normal transient current flows to the load, the first voltage does not exceed the second voltage.

9. The overcurrent protection circuit of claim 8, wherein:

if an overcurrent flows to the switching element to make the first voltage, which is generated with the first amplification factor, exceed the second voltage, the switching element is inactivated and the inactivated state of the switching element is maintained.

10. The overcurrent protection circuit of claim 9, wherein:

after the predetermined period in which the first voltage is generated with the first amplification factor, the third switch is rendered inoperative to change the first amplification factor to the second amplification factor;

if the first voltage exceeds the second voltage thereafter, the third switch is activated to resume the first amplification factor for the predetermined period; and if the first voltage is above the second voltage after a predetermined number of repetitions of the amplification factor changing operation, the switching element is rendered inoperative.

11. An overcurrent protection circuit for protecting a switch from an overcurrent, the switch having a first electrode connected to a power source through a conductor involving an internal impedance and a second electrode connected to a load, the overcurrent protection circuit comprising:

a current detector to detect a current supplied to the load and generate a first voltage corresponding to the detected current, and the current detector having a current source controlled according to a voltage difference between the first and second electrodes of the switch, a first end of the current source is connected to the first electrode of the switch, a second end of the current source is grounded through a first resistor, and a voltage drop due to the first resistor produces the first voltage;

a voltage detector to generate a second voltage corresponding to a voltage at the second electrode of the switch; and a comparator having a first input terminal to receive the first voltage and a second input terminal to receive the second voltage, wherein:

when the current flowing through the load increases, the first voltage increases and the second voltage decreases; and the switch is rendered operative and inoperative in response to an output of the comparator.

12. The overcurrent protection circuit of claim 11, further comprising:

a potentiometer to generate a voltage corresponding to a voltage at the first electrode of the switch, wherein:

when a voltage at the second electrode of the switch is below a reference voltage, an output of the potentiometer is selectively connected to the second input terminal of the comparator, the second voltage is selectively disconnected from the second input terminal of the comparator; and the second end of the current source is disconnected from the first resistor.

13. A method of protecting a switch from an overcurrent, the switch having a first electrode connected to a power source through a conductor involving an internal impedance and a second electrode connected to a load, the method comprising:

detecting a current supplied to the load by sensing a current corresponding to a voltage difference between the first and second electrodes of the switch and by generating a first voltage proportional to the sensed current;

detecting a voltage at the second electrode of the switch and generating a second voltage corresponding to the detected voltage, the first voltage increasing and the second voltage decreasing if the current supplied to the load increases; and comparing the first and second voltages with each other and rendering the switch operative and inoperative according to a result of the comparison.

* * * * *

UNITED STATES PATENT AND TRADEMARK OFFICE
CERTIFICATE OF CORRECTION

| | |
|---|---|
| PATENT NO. | : 7,177,130 B2 |
| APPLICATION NO. | : 10/478106 |
| DATED | : February 13, 2007 |
| INVENTOR(S) | : Shunzou Ohshima |

It is certified that error appears in the above-identified patent and that said Letters Patent is hereby corrected as shown below:

Claim 5, col. 17, line 17, "anyone of" should read -- any one of --.

Signed and Sealed this

Seventeenth Day of July, 2007

JON W. DUDAS
*Director of the United States Patent and Trademark Office*